US012770709B2

(12) United States Patent
Willey

(10) Patent No.: US 12,770,709 B2
(45) Date of Patent: Oct. 20, 2026

(54) LINK STRESS PATTERN TO ENSURE COMMAND ADDRESS BUS INTEGRITY

(71) Applicant: Advanced Micro Devices, Inc., Santa Clara, CA (US)

(72) Inventor: Aaron D. Willey, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 150 days.

(21) Appl. No.: 18/755,394

(22) Filed: Jun. 26, 2024

(65) Prior Publication Data

US 2026/0004869 A1 Jan. 1, 2026

(51) Int. Cl.
*G11C 29/02* (2006.01)
*G11C 29/52* (2006.01)
*G11C 29/56* (2006.01)

(52) U.S. Cl.
CPC ........ *G11C 29/52* (2013.01); *G11C 29/56004* (2013.01)

(58) Field of Classification Search
CPC .......................... G11C 29/52; G11C 29/56004
USPC ..................................................... 365/185.09
See application file for complete search history.

(56) References Cited

U.S. PATENT DOCUMENTS 6,212,090 B1 * 4/2001 Akita ...................... G11C 8/14 365/69
10,203,875 B1 2/2019 Ying et al.
2005/0108458 A1 5/2005 Vogt
2009/0006912 A1 * 1/2009 Hur ........................ G11C 29/10 714/E11.159
2014/0189224 A1 7/2014 Kostinsky et al.
2018/0130506 A1 * 5/2018 Kang .................. G11C 11/4096
2018/0181504 A1 6/2018 Morris et al.
2019/0018732 A1 * 1/2019 Ryu .................... G06F 11/1068
2019/0163393 A1 * 5/2019 Cox ...................... G06F 3/0673
2020/0110716 A1 4/2020 Mozak et al.
2022/0246183 A1 * 8/2022 Bloemer .............. G11C 7/1093
2022/0300197 A1 * 9/2022 Sethuraman .......... G06F 3/0673
2024/0289018 A1 * 8/2024 Kim ...................... G06F 3/0611
2025/0307045 A1 * 10/2025 Pelt ...................... G06F 11/076

OTHER PUBLICATIONS

International Search Report and Written for PCT/US2025/028727 Dated Sep. 12, 2025.
JEDEC Standard, “Graphics Double Data Rate 7 SGRAM Standard (GDDR7),” JEDEC Solid State Technology Associate 2024, Apr. 2024.

* cited by examiner

*Primary Examiner* — Ly D Pham
(74) *Attorney, Agent, or Firm* — Patterson + Sheridan, LLP

(57) ABSTRACT

Embodiments herein describe link stress patterns to ensure command address bus integrity. In an example, a memory controller asserts a link stress pattern of bits on command address (CA) links of a CA bus of a dynamic random-access memory (DRAM) device, while the DRAM device is in a pre-operating state in which the DRAM device does not recognize memory access commands and in which a CA bus parity circuit of the DRAM device is enabled, where the link stress pattern of bits extends over multiple clock cycles of the DRAM device. The memory controller also monitors an error output of the DRAM device for parity errors, while asserting the link stress pattern of bits on the CA links.

17 Claims, 7 Drawing Sheets

LINK STRESS PATTERN TO ENSURE COMMAND ADDRESS BUS INTEGRITY

TECHNICAL FIELD

Examples of the present disclosure generally relate to dynamic random-access memory (DRAM) and, more particularly, to link stress patterns to ensure DRAM command address (CA) bus integrity.

BACKGROUND

A memory controller may perform calibration/training procedures on a dynamic random-access memory (DRAM) device following initialization of the DRAM device. There may be idle periods during which validation procedures may be performed.

SUMMARY

Link stress patterns to ensure command address bus integrity are described herein. One example is a system that includes a memory controller that asserts a link stress pattern of bits on command address (CA) links of a CA bus of a dynamic random-access memory (DRAM) device, while the DRAM device is in a pre-operating state in which the DRAM device does not recognize memory access commands and in which a CA bus parity circuit of the DRAM device is enabled, where the link stress pattern of bits extends over multiple clock cycles of the DRAM device. The memory controller may monitor an error output of the DRAM device for parity errors, while asserting the link stress pattern of bits on the CA links.

Another example described herein is a system that includes a host system and a memory system, where the memory system includes a memory controller, a dynamic random-access memory (DRAM) device, and a command address (CA) bus having multiple CA links between the memory controller and the DRAM device. The host system program the memory controller with a link stress pattern of bits. The wherein the memory controller asserts the link stress pattern of bits on the CA links while the DRAM device is in a pre-operating state in which the DRAM device does not recognize memory access commands and in which a CA bus parity circuit of the DRAM device is enabled, where the link stress pattern of bits extends over multiple clock cycles of the DRAM device. The memory controller may also monitor an error output of the DRAM device for parity errors, while asserting the link stress pattern of bits on the CA links.

Another example described herein is a method that includes asserting a link stress pattern of bits on command address (CA) links of a CA bus of a dynamic random-access memory (DRAM) device, while the DRAM device is in a pre-operating state in which the DRAM device does not recognize memory access commands and in which a CA bus parity circuit of the DRAM device is enabled, where the link stress pattern of bits extends over multiple clock cycles of the DRAM device, and monitoring an error output of the DRAM device for parity errors while asserting the link stress pattern of bits on the CA links.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
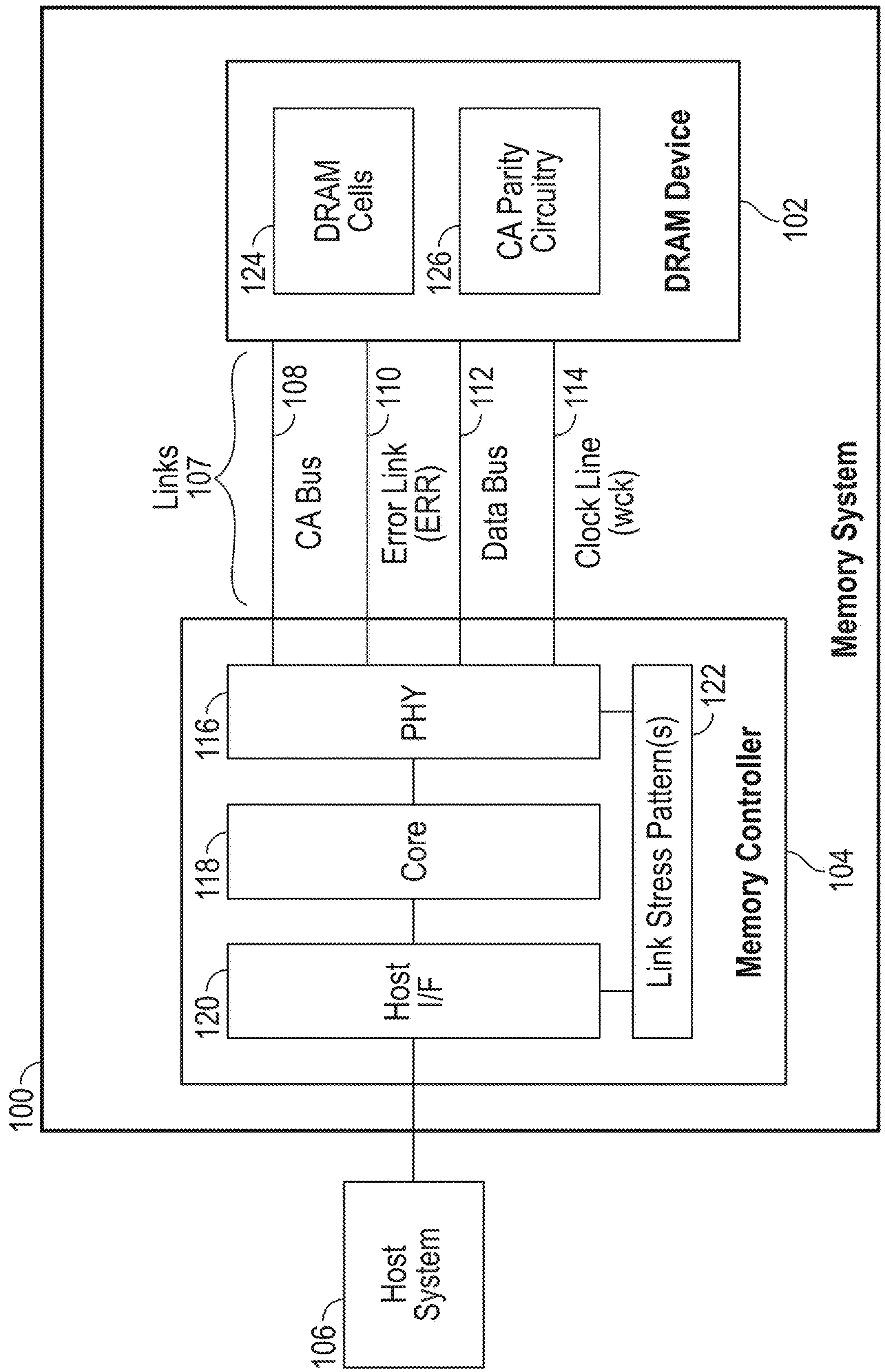
FIG. 1 is a block diagram of a memory system that includes a dynamic random-access memory (DRAM) device and a memory controller that interfaces between the DRAM device and a host system, according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe link stress patterns to ensure command address (CA) bus integrity of a dynamic random-access memory (DRAM) system. The link stress patterns may be applied during idle periods, such as between a training state and an operating state.

FIG. 1 is a block diagram of a memory system 100 that includes a dynamic random-access memory (DRAM) device 102 and a memory controller 104 that interfaces between DRAM device 102 and a host system 106, according to an embodiment. Host system 106 may represent, for example and without limitation, a computer system, a network interface controller, and/or direct memory access (DMA) device.

Memory system 100 further includes links 107 between DRAM device 102 and memory controller 104. In the example of FIG. 1, links 107 include command address (CA) links 108 of a CA bus, that provide commands from memory controller 104 to DRAM device 102. Links 107 further include an error link 110 that provides an error signal ERR from DRAM device 102 to memory controller 104.

Links 107 further include data links 112 to exchange data between memory controller 104 and DRAM device 102, and one or more clock lines 114 to provide one or more clocks (e.g., wck) from memory controller 104 to DRAM device 102. Links 107 may include additional links. Memory system 100 may include multiple channels, each of which may include a respective set of links 107.

DRAM device 102 includes DRAM cells 124 and CA parity circuitry 126. CA parity circuitry 126 monitors bits of CA links 108, and reports instances of non-parity as an error signal ERR over error link 110. In an example, CA parity circuitry 126 determines parity based on a number of logic 1s on CA links 108. If there is an even number of 1s, CA parity circuitry 126 does not report an ERR. If there is an odd number of 1s, CA parity circuitry 126 reports an ERR. In another example, CA parity circuitry 126 determines parity based on the number of 1s on CA links 108 and a parity bit (e.g., a CAPAR bit). If the CAPAR bit is set (e.g., logic 1) and there is an odd number of 1s on CA links 108, CA parity circuitry 126 does not report an ERR. If the CAPAR bit is set and there is an even number of 1s on CA links 108, CA parity circuitry 126 reports an ERR.

Memory controller 104 includes a DRAM interface, illustrated here as a physical layer device (PHY) 116, that interfaces with DRAM device 102. Memory controller 104 may further include a host interface 120 that interfaces with host system 106, and a core 118 that performs core functions of memory controller 104.

Memory controller 104 further includes link stress patterns 122, which may be programmable/configurable by host system 106 via host interface 120. Example link stress patterns 122 are described further below with reference to FIGS. 5A, 5B, and 5C.

Memory system 100 may be designed to operate in accordance with Joint Electron Device Engineering Council (JEDEC) Standard 239.01, titled "Graphics Double Data Rate 7 SGRAM Standard (GDDR7)," (the GDDR7 standard), Memory system 100 is describes below with references to the GDDR7 standard, for illustrative purposes. Memory system 100 is not limited to the GDDR7 standard.

Figure 2:
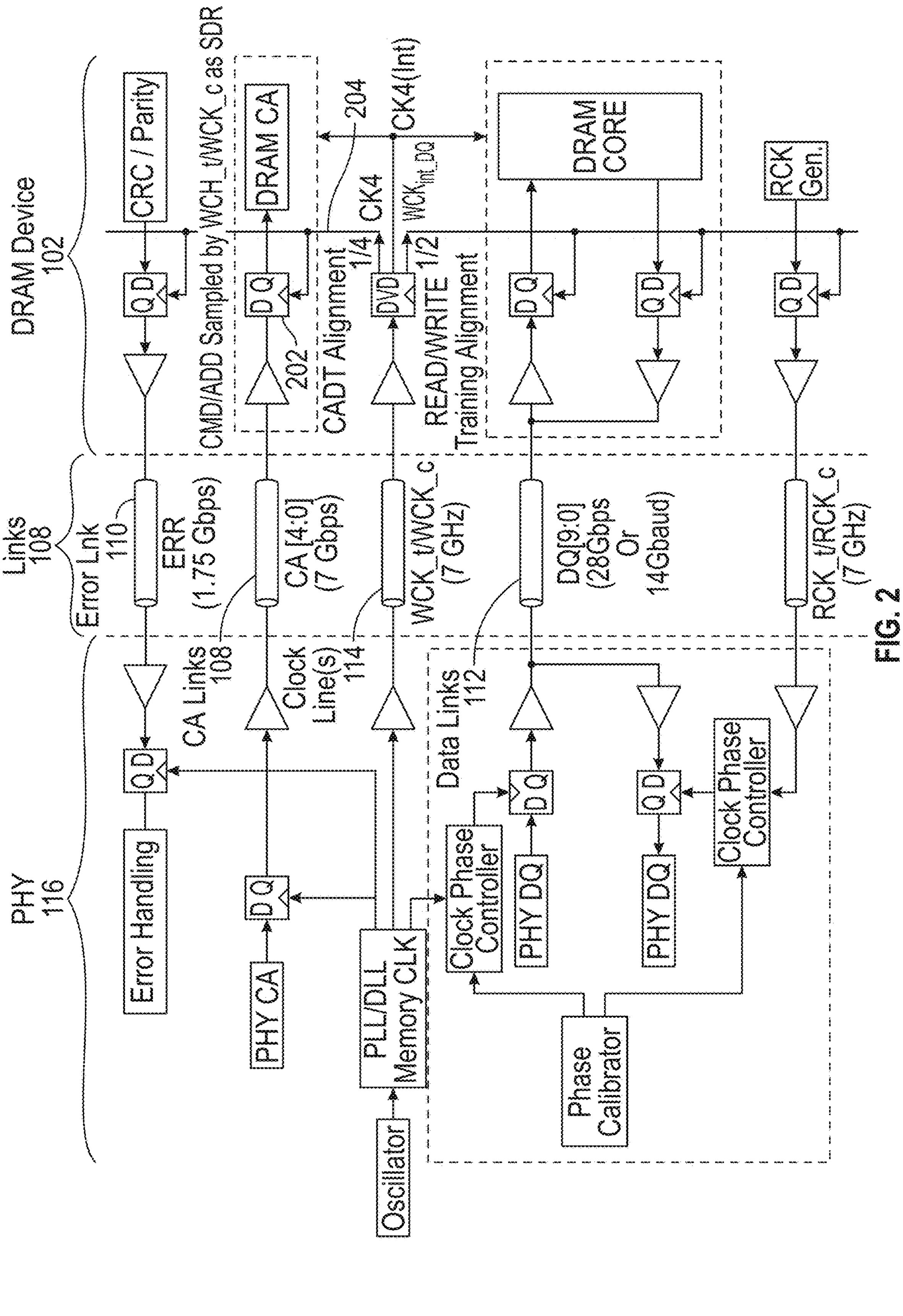
FIG. 2 is a schematic diagram of the DRAM device and physical layer device (PHY) of the memory controller, according to an embodiment.

FIG. 2 is a schematic diagram 200 of DRAM device 102 and PHY 116, according to an embodiment. In FIG. 2, CA links 108 includes five links, denoted CA {4:0}. PHY 116 may transmit command packets over CA links 108 as relatively high data rate modulated signals. As an example, and without limitation, memory controller 104 may transmit command packets over CA links 108 as 7 gigabits/second (Gbps), pulse amplitude modulated (PAM) signals. CA sampling circuits 202 of DRAM device 102 may sample the command packets based on corresponding sampling clocks 204.

For relatively high data rate signals (i.e., Gbps signals), memory controller 104 may train CA link interfaces of DRAM device 102 to ensure that the CA link interface operates with optimal timings. CA training may include adjusting delays associated with CA links 108 and/or sampling clocks 204. For example, and without limitation, in a CA training state, memory controller 104 may train the CA link interfaces to sample signals received over CA links 108 at centers of eye openings (e.g., by adjusting a locally calibrated delay line to center sampling clocks 204 within CA bits), to optimize setup and hold times of the received signals relative to sampling clocks 204, to improve timing margins of CA links 108, to determine which positive edge of clock WCK (received over clock line 114) corresponds to a positive edge of an internal clock of DRAM device 102, and/or to de-skew bits demodulated from the signals received over CA links 108 (e.g., by adjusting bit delay line (BDL) delays of CA links 108).

Memory system 100 may enter the CA training state following system initialization, upon exit of a reduced power-consumption (e.g., sleep) state, following a failure of CA link stress testing, and/or on command. DRAM device 102 may be designed such, when in the CA training mode, the only command DRAM device 102 will recognize is an CA training exit (CATX) command. This may be useful to prevent DRAM device 102 from inadvertently/pre-maturely entering an operating state.

In addition to training interfaces of CA links 108, memory controller 104 may use link stress patterns 122 and CA parity circuitry 126 to stress CA links 108 at a high data rate (e.g., 7 Gbps) to ensure that bit flips do not occur at the high data rate. Bit flips may result in aliasing, in which DRAM device 102 misinterprets commands received over CA links 108. Memory controller 104 may stress CA links with link stress patterns 122 during periods or states in which DRAM device 102 will recognize only a relatively limited set of commands. As an example, and without limitation, DRAM device 102 may be designed such that, upon conclusion of CA training, the only command that DRAM device 102 will recognize is a command start point (CST) pattern of bits, which cause DRAM device 103 to transition to an operating state. In this example, memory controller 104 may stress CA links 108 prior to the CST pattern, and link stress patterns 122 may include any pattern other than that of the CST pattern.

Figure 3:
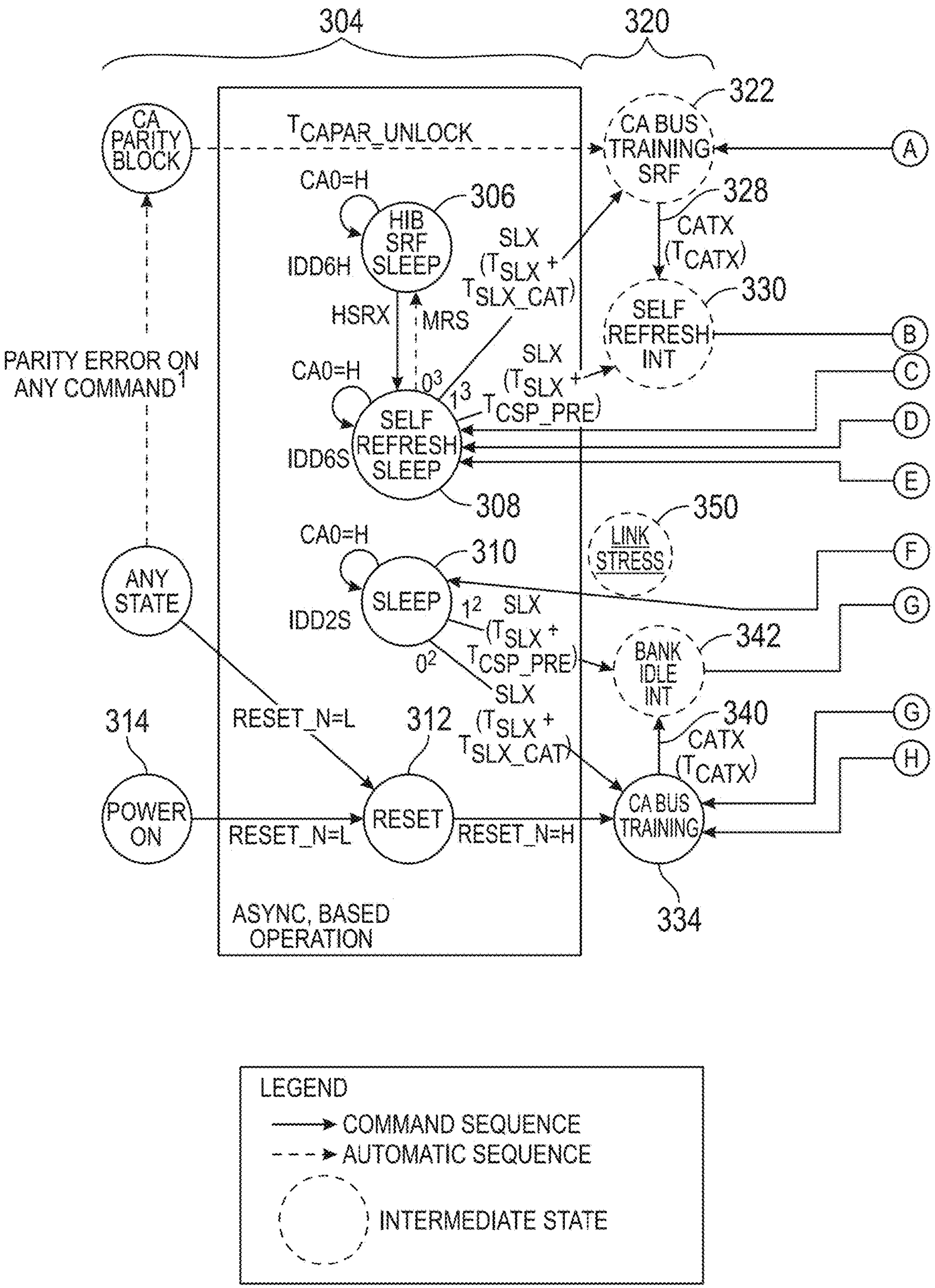
FIG. 3 is a state diagram of the memory system, according to an embodiment.
Figure 3:
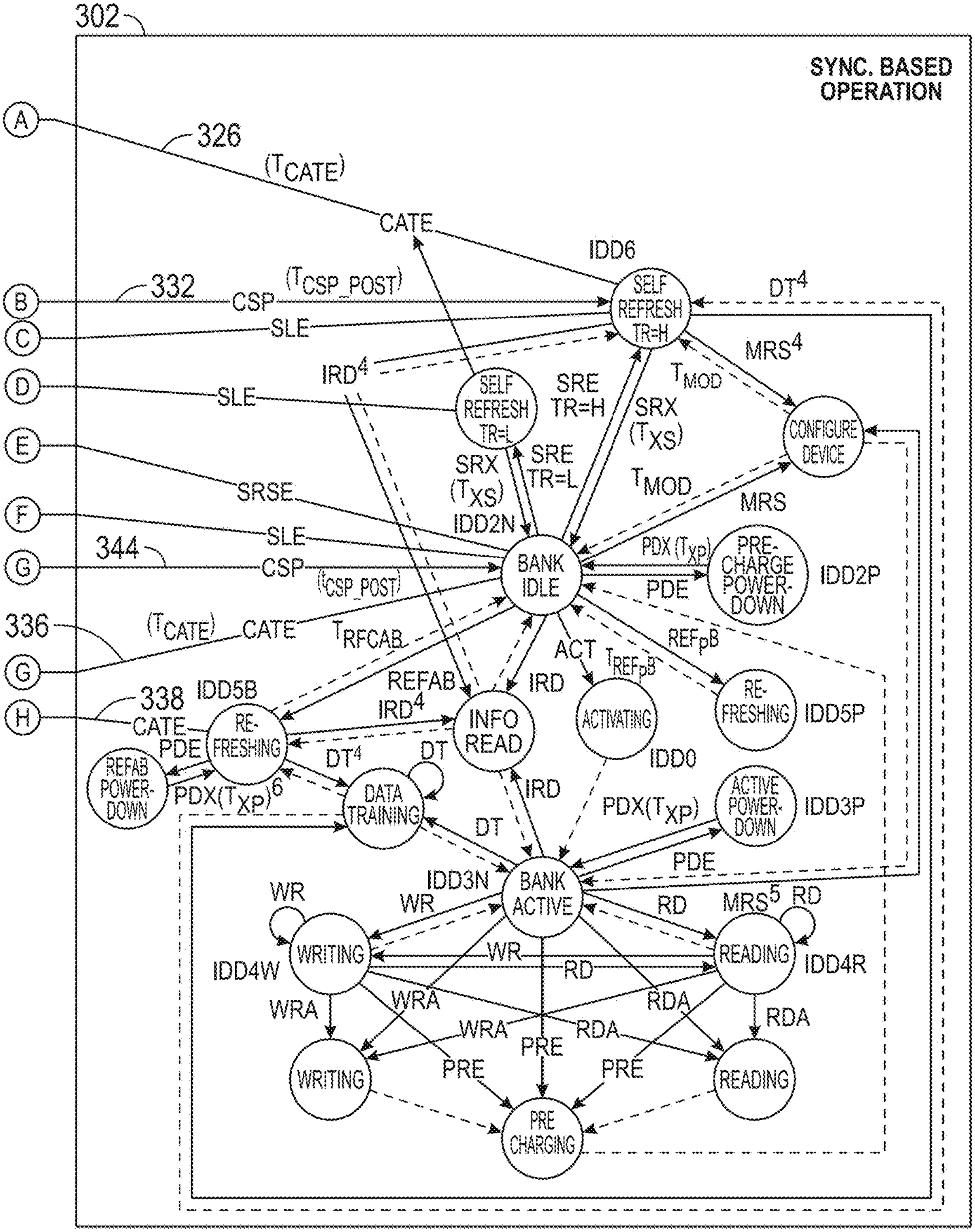

FIG. 3 is a state diagram 300 of memory system 100, according to an embodiment. State diagram 300 includes operating states 302 and pre-operating states 304 of memory system 100. Operating states 302 include various states of memory system 100 in which DRAM recognizes a variety of operating commands (e.g., memory access commands) from PHY 116. In the example of FIG. 3, pre-operating states 304 include reduced-power consumption (e.g., sleep) states 306, 308, and 310, and a reset state 312 that follows power-on 314. In pre-operating states 304, DRAM device 102 may recognize a relatively limited number of non-operating commands, which may include a sleep exit (SLX) command and/or a reset command.

State diagram 300 further includes intermediate states 320, which may include one or more calibration and/or training states. In intermediate states 320, DRAM device 102 may recognize a relatively limited number of non-operating commands, which may include, and/or which may be limited to a CA training exit (CATE) command. Intermediate states 320 and pre-operating states 304 may be collectively referred to as non-operating states.

In the example of FIG. 3, intermediate states 320 include a CA training self-refresh (SRF) state 322, in which memory controller 104 performs CA training, such as described further above. Memory system 100 may enter CA training SRF state 322 from a pre-operating state 304 and/or from one or more operating states 302, illustrated here with a CA training entry (CATE) command 326. Upon completion of CA training at state 322, memory system may issue a CA training exit command (CATX) 328 to place memory system 100 in a self-refresh interim state 330. Thereafter, memory system may issue a command start point (CSP) command 332 to place DRAM device 102 in an operating state 302. When in self-refresh interim state 330, DRAM device 102 may perform tasks in preparation for an operating state 302. DRAM device 102 may, for example, enable CA parity circuitry 126 and change a clock tree structure. Memory system 100 may wait a period of time to permit DRAM device 102 to complete the tasks, before issuing a CSP command 332 (i.e., a CSP pattern).

Intermediate states 320 further include a second CA training state 334, in which memory controller 104 trains CA links 108, such as described further above. Memory system 100 may enter CA training state 334 from sleep state 310, reset state 312, and/or from one or more operating states 302 (e.g., based on a CATE command 336 and/or a CATE command 338). Upon completion of CA training at state 334, memory system may issue a CATX command 340 to place memory system 100 in a bank idle state 342. Thereafter, memory controller 104 may issue a CSP command 344 place DRAM device 102 in an operating state 302. When in bank idle state 342, DRAM device 102 may perform tasks in preparation for an operating state 302, such as described above. Memory system 100 may wait a period of time to permit DRAM device 102 to complete the tasks, before issuing CSP command 344.

Intermediate states 320 further include a CA link stress state 350, in which memory system 100 stresses CA links with link stress patterns 122 (i.e., CA link stress testing), such as described further below. Memory system 100 may enter CA link stress state 350 from CA bus training state 322, self-refresh interim state 330, CA training state 334, bank idle state 342, one or more other training/calibration states, pre-operating states 304, and/or operating states 302.

When memory system is in CA link stress state 350, CA parity circuitry 126 is enabled. CA parity circuitry 126 may be disabled when DRAM is in a non-operating state, such as reduced-power consumption (i.e., sleep state), and/or during calibration/training of DRAM device 102. DRAM device may enable CA parity circuitry 126 following receipt of a training exit command from memory controller 104, such as a CATX command.

Figure 4:
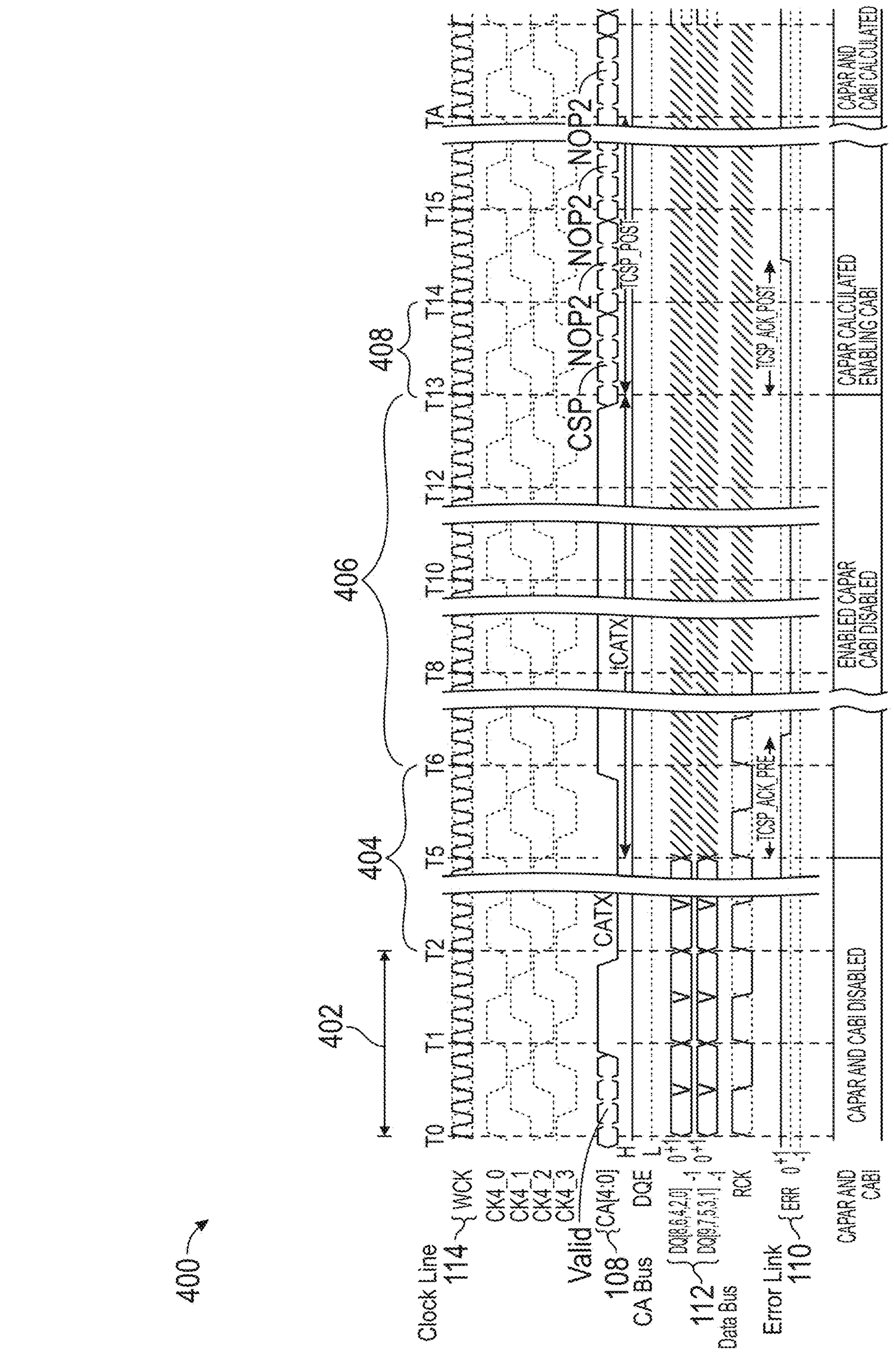
FIG. 4 depicts timing diagrams for the memory system, for a situation in which the memory system transitions from a command address (CA) training state to an operating state, according to an embodiment.

FIG. 4 depicts timing diagrams 400 for memory system 100, for a situation in which memory system 100 transitions from a CA training state to an operating state, according to an embodiment. During time 402 (i.e., prior to time T2), memory controller 104 performs CA training (e.g., state 322 and/or state 334 in FIG. 3). During time 404 (i.e., from time T2 to time T6), memory controller 104 issues a CA training exit (CATE) command. In the example of FIG. 4, the CATE command is a sequence of logic 0s on CA links 108 CA {4:0}. In other words, memory controller 104 holds all bits of CA links 108 at logic 0 over time 404, illustrated here as 16 unit intervals (UIs) or clock cycles.

Memory controller 104 may pause or wait a period of time 406 as DRAM device 102 transitions from CA training. During period 406 DRAM device 102 may, for example, change a clock structure (e.g., may enable and/or disable a clock tree structure), disable feedback features of the CA training, and enable CA parity circuitry 126. Period 406 may represent a pre-determined period of time. Alternatively, memory controller 104 may wait to receive a CATX acknowledgment from DRAM device 102. Period 406 may be referred to as CATX time.

During a period of time 408, memory controller 104 issues a CSP pattern to place DRAM device 102 in an operating state. The CSP pattern may include a sequence of logic 1s on all bits of CA links 108, for a pre-determined number of UIs. As described further below, memory controller 104 may delay issuing the CSP pattern to perform link stress testing of CA links 108.

Figure 5A:
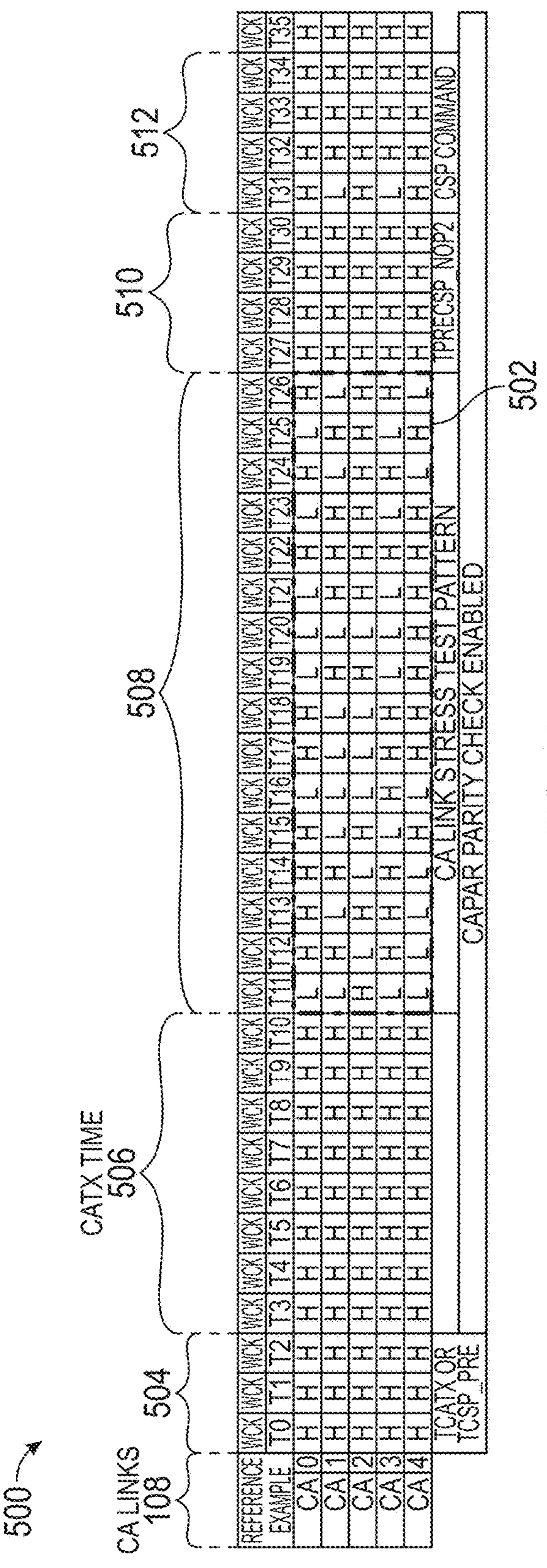
FIG. 5A depicts a timing diagram for a first link stress pattern, according to an embodiment.
Figure 5B:
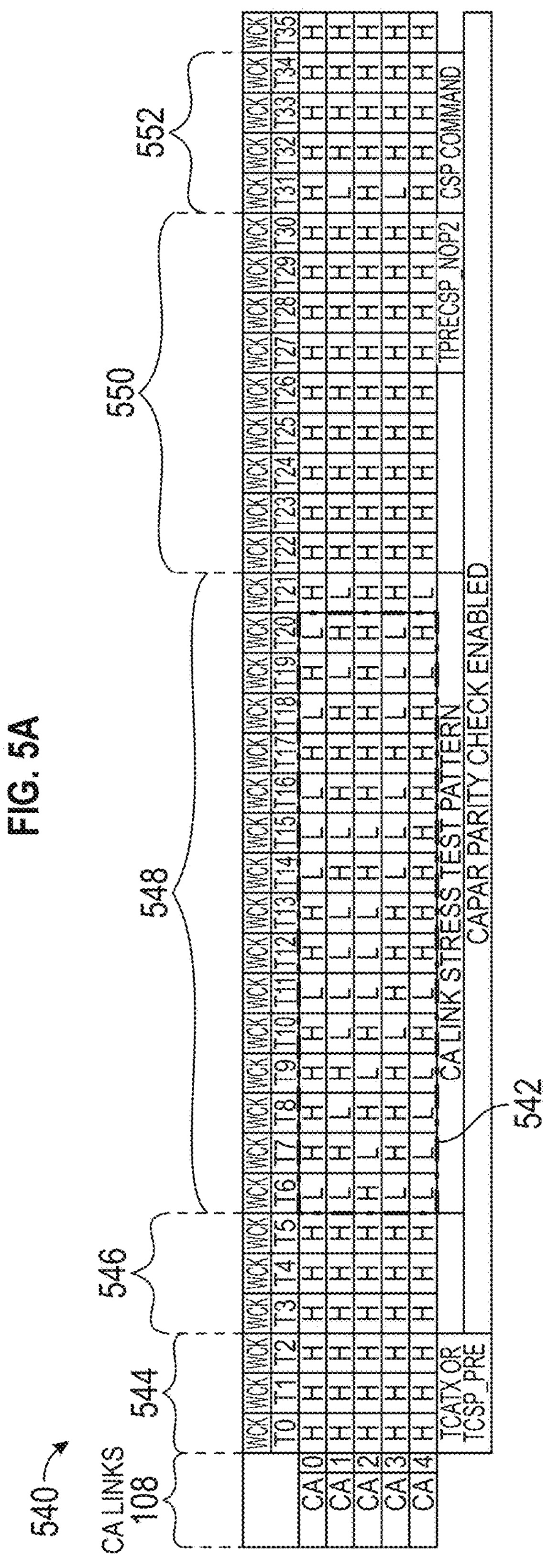
FIG. 5B depicts a timing diagram for a second link stress pattern, according to an embodiment.
Figure 5C:
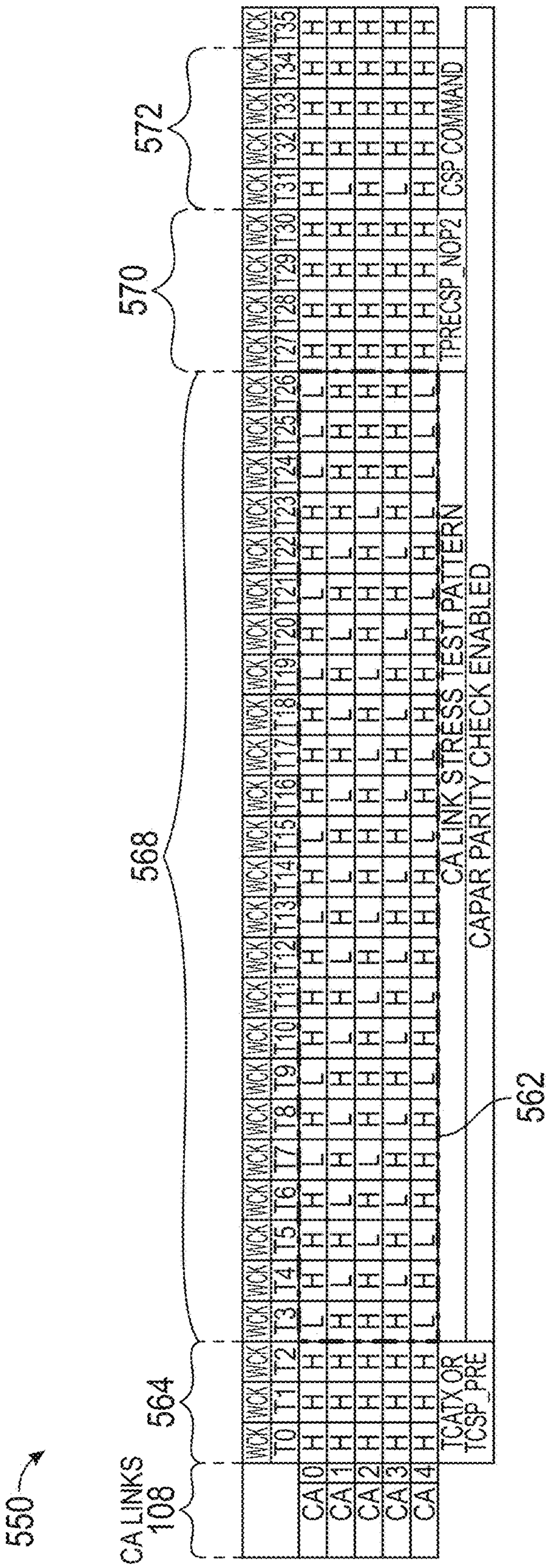
FIG. 5C depicts a timing diagram for a third link stress pattern, according to an embodiment.

FIG. 5A depicts a timing diagram 500 for a link stress pattern 502, according to an embodiment. FIG. 5B depicts a timing diagram 540 for a link stress pattern 542, according to an embodiment. FIG. 5C depicts a timing diagram 560 for a link stress pattern 562, according to an embodiment.

In FIGS. 5A, 5B, and 5C, "H" represents logic 1 and "L" represents logic 0. Further in FIGS. 5A, 5B, and 5C, a CAPAR parity check is enabled (i.e., a CAPAR bit is set), such that CA parity circuitry 126 determines parity based on a combination of CA links CA0, CA1, CA2, CA3, and CA4 and the CAPAR bit. In these examples, CA parity circuitry 126 returns an ERR if CA links CA0, CA1, CA2, CA3, and CA4 have even parity (i.e., an even number of 1s), in any given cycle of clock wck. Link stress patterns 502, 542, and 562 are provided for illustrative purposes. A link stress pattern 122 may extend for any desired number of UIs, and may include one or more of a variety of patterns, provided that the pattern does not match the CSP pattern. FIGS. 5A, 5B, and 5C are described below with reference to FIG. 6.

Link stress patterns 502, 542, and 562 are provided for illustrative purposes. A link stress pattern 122 may extend for any desired number of UIs, and may include one or more of a variety of patterns, provided that the pattern does not match the pattern of the CSP command.

Link stress patterns 122 may be rolling window CA parity compliant because DRAM internal CK4 is not defined before recognition of CSP command. Rolling window means that calculation is performed for every 4 WCK cycles that starts from all WCK cycles, WCK0, WCK1, WCK2 and WCK3, Only RNOP2+CNOP2 commands are allowed during tPRECSP_NOP2 in TABLE 119.

In FIGS. 5A, 5B, and 5C. "H" represents logic 1 and "L" represents logic 0. Further in FIGS. 5A, 5B, and 5C, a CAPAR parity check is enabled (i.e., a CAPAR bit is set), such that CA parity circuitry 126 determines parity based on a combination of CA links CA0, CA1, CA2, CA3, and CA4 and the CAPAR bit. In these examples, CA parity circuitry 126 returns an ERR if CA links CA0, CA1, CA2, CA3, and CA4 have even parity (i.e., an even number of 1s) in any given cycle of clock wck.

Figure 6:
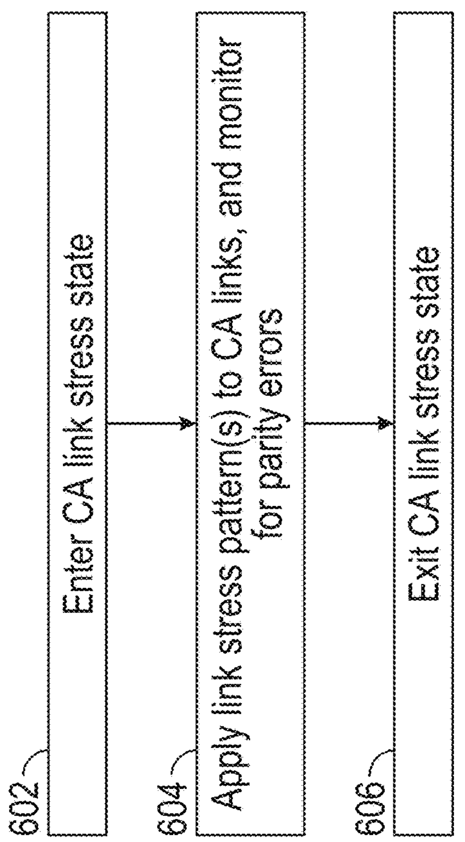
FIG. 6 depicts a method of CA link stress testing, according to an embodiment.

FIG. 6 depicts a method 600 of CA link stress testing, according to an embodiment. Method 600 is described below with reference to memory system 100. Method 600 is not, however, limited to the example of memory system 100.

At 602, memory system 100 enters a CA link stress state (e.g., state 350 in FIG. 3), to perform CA link stress testing of CA links 108. Memory system 100 may enter CA link stress state 350 from an operating state 302, from a pre-operating state 304 (e.g., upon initialization and/or from a sleep state), and/or from an intermediate state 320 (e.g., from CA bus training state 322 and/or 334), and/or from an operating state 302.

When entering the CA link stress state, memory controller 104 may pause or wait a period of time sufficient to permit DRAM device 102 to enable CA parity circuitry 126. In FIG. 4, for example, upon completion of CA training, memory controller 104 issues the CA training exit (CATX) command, followed by wait period 406 (i.e., CATX time). In this example, memory system 100 may enter the CA link stress state at time T13 (i.e., and delay issuing the CSP command until completion of CA link stress testing).

In FIG. 5A, memory controller 104 issues a CA training exit (CATX) command or a pre-start point command (CSP_PRE) during time 504, then waits CATX time 506 before entering a CA link stress state at period 508. During CATX time 506, memory controller may assert a pattern and/or a non-operational (NOP) command(s) on CA links 108, which may be based on a standard. In the example of FIG. 5A, memory controller 104 asserts Hs on CA links 108.

In FIG. 5B, memory controller 104 issues a CA training exit (CATX) command or a pre-start point command (CSP_PRE) during time 544, then waits CATX time 546 before entering a CA link stress state at period 548. During CATX time 546, memory controller may assert a pattern and/or a non-operational (NOP) command(s) on CA links 108, such as described above with respect to FIG. 5A.

In FIG. 5C, memory controller 104 issues a CA training exit (CATX) command during time 564, and may wait a (CSP_PRE period, before entering a CA link stress state at period 568.

At 604, while in the CA link stress state, memory controller 104 applies one or more link stress patterns 122 to CA links 108, and monitors error link 110 for parity errors ERR.

In FIG. 5A, memory controller 104 applies link stress pattern 502 over a period 505 (i.e., clock cycles t11 through t26). In the example of FIG. 5A, the CAPAR bit is set and link stress pattern 502 includes an odd number of H bits for each cycle of clock wck. At time t11, for example, memory controller 104 asserts L, L, H, L, L on corresponding CA links CA0, CA1, CA2, CA3, and CA4. In this example, CA parity circuitry 126 determines that CA links CA0, CA1, CA2, CA3, and CA4, and the CAPAR bit, have an even number of H bits, and thus does not issue an ERR.

In FIG. 5B, memory controller 104 applies link stress pattern 542 over a period 548 (i.e., clock cycles t6 through t21). In the example of FIG. 5B, the CAPAR bit is set and link stress pattern 542 includes an odd number of H bits for each cycle of clock wck, such as described above with respect to FIG. 5A.

In FIG. 5C, memory controller 104 applies link stress pattern 562 over a period 568 (i.e., clock cycles t3 through t26). In the example of FIG. 5C, the CAPAR bit is set and link stress pattern 562 includes an odd number of H bits for each cycle of clock wck, such as described above with respect to FIG. 5A.

Further regarding FIG. B5, link stress pattern 542 may be useful as a WCK clock cycle based shift pattern. As an example, a GDDR7 DRAM may include four CA sampling circuits 202 (FIG. 2) that utilize rising edges of WCK0, WCK1, WCK2 and WCK3 clock cycles (e.g., 4 phases of clock wck). A WCK clock cycle based shift pattern may be useful to check the status of all four samplers.

Further regarding FIG. 5C, link stress pattern 562 is longer than link stress patterns 502 and 542 (i.e., link stress pattern 562 extends over more UIs). Such an extended-length link stress pattern may be useful to check all CA samplers in GDDR7 DRAM (i.e. in addition to, or as an alternative to a WCK clock cycle based shift pattern).

If DRAM device 102 detects/reports a parity error ERR during CA link stress testing at 606, memory controller 104 may report the error to host system 106 and/or may perform a remedial action, such as exiting the CA stress testing state returning to a calibration/training state (e.g. CA training). Memory system 100 may be configurable (e.g., with a blocking command) to remain in the CA stress test state in the event of a parity error.

In an example, a link stress pattern 122 may be intentionally designed with parity errors to validate that CA parity circuitry 126 detects the parity errors. In this example, memory system 100 may be configured (e.g., with a blocking command) to remain in the CA stress test state in the event of a parity error.

In another example, memory controller 104 applies a link stress pattern 122 at a phase offset of a sample clock of DRAM device 102. This may be useful to validate that CA parity circuitry 126 detects parity errors under phase stress conditions.

At 606, memory controller 104 exits CA link stress testing (e.g., upon successful completion of CA link stress testing). In an example, memory controller 104 exits CA link stress testing by issuing the CSP command to place DRAM device 102 in an operating state. Memory controller 104 may wait a period of time before issuing the CSP command. In FIG. 5A, memory controller 104 waits a period 510 (i.e., UIs t27 to t30), then issues the CSP command during a period 512. During wait period 510, memory controller 104 may issue a pre-CSP NOP command, illustrated here as a PRECSP_NOP2 command. In FIG. 5B, memory controller waits a period 552 (i.e., UIs t22 to t30), then issues the CSP command during a period 512. During wait period 550, memory controller 104 may issue a pre-CSP NOP command, such as described above with respect to FIG. 5A. In FIG. 5C, memory controller waits a period 570 (i.e., UIs t22 to t30), then issues the CSP command during a period 572. During wait period 570, memory controller 104 may issue a pre-CSP NOP command, such as described above with respect to FIG. 5A.

Commands and waiting periods, including NOP commands, are described for illustrative purposes. Commands and waiting may vary based on technical requirements and/or specifications.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A system, comprising:

a dynamic random-access memory (DRAM) device; and a memory controller configured to, assert a link stress pattern of bits on command address (CA) links of a CA bus of the DRAM device, while the DRAM device is in a pre-operating state in which the DRAM device does not recognize memory access commands and in which a CA bus parity circuit of the DRAM device is enabled, wherein the link stress pattern of bits extends over multiple clock cycles of the DRAM device; and monitor an error output of the DRAM device for parity errors, while asserting the link stress pattern of bits on the CA links;

wherein the DRAM device is configured to recognize a command start point pattern of bits asserted on the CA links when in the pre-operating state, and to transition from the pre-operating state to an operating state based on the command start point pattern of bits; and wherein the link stress pattern of bits differs from the command start point pattern of bits.

2. The system of claim 1, wherein the memory controller is further configured to:

modulate carriers with the link stress pattern of bits; and transmit the modulated carriers over the CA links at a data rate at which the DRAM device samples the CA links when the DRAM device is in an operating state.

3. The system of claim 1, wherein the memory controller is further configured to:

assert the link stress pattern of bits on the CA links following a CA training procedure; and issue the command start point pattern of bits over the CA bus subsequent to asserting the link stress pattern of bits on the CA links, to place the DRAM device in an operating state.

4. The system of claim 1, wherein the memory controller is further configured to:

assert the link stress pattern of bits at a phase offset of a sample clock of the DRAM device.

5. The system of claim 1, wherein the memory controller is further configured to report parity errors to a host system.

6. The system of claim 1, wherein the link stress pattern of bits is programmable by a host system via a host interface of the memory controller.

7. A system, comprising:

a host system; and a memory system comprising a memory controller, a dynamic random-access memory (DRAM) device, and a command address (CA) bus that comprises multiple CA links between the memory controller and the DRAM device;

wherein the host system is configured to program the memory controller with a link stress pattern of bits;

wherein the memory controller is configured to:

assert the link stress pattern of bits on the CA links while the DRAM device is in a pre-operating state in which the DRAM device does not recognize memory access commands and in which a CA bus parity circuit of the DRAM device is enabled, wherein the link stress pattern of bits extends over multiple clock cycles of the DRAM device; and monitor an error output of the DRAM device for parity errors, while asserting the link stress pattern of bits on the CA links;

wherein the DRAM device is configured to recognize a command start point pattern of bits asserted on the CA links when in the pre-operating state, and to transition from the pre-operating state to an operating state based on the command start point pattern of bits; and wherein the link stress pattern of bits differs from the command start point pattern of bits.

8. The system of claim 7, wherein the memory controller is further configured to:

modulate carriers with the link stress pattern of bits; and transmit the modulated carriers over the CA links at a data rate at which the DRAM device samples the CA links when the DRAM device is in an operating state.

9. The system of claim 7, wherein the memory controller is further configured to:

assert the link stress pattern of bits on the CA links following a CA training procedure; and issue the command start point pattern of bits over the CA bus subsequent to asserting the link stress pattern of bits on the CA links, to place the DRAM device in an operating state.

10. The system of claim 7, wherein the memory controller is further configured to:

assert the link stress pattern of bits at a phase offset of a sample clock of the DRAM device.

11. The system of claim 7, wherein the memory controller is further configured to report parity errors to the host system.

12. The system of claim 7, wherein the link stress pattern of bits is programmable by the host system via a host interface of the memory controller.

13. A method, comprising:

asserting a link stress pattern of bits on command address (CA) links of a CA bus of a dynamic random-access memory (DRAM) device, while the DRAM device is in a pre-operating state in which the DRAM device does not recognize memory access commands and in which a CA bus parity circuit of the DRAM device is enabled, wherein the link stress pattern of bits extends over multiple clock cycles of the DRAM device; and monitoring an error output of the DRAM device for parity errors, while asserting the link stress pattern of bits on the CA links;

wherein the DRAM device is configured to recognize a command start point pattern of bits asserted on the CA links when in the pre-operating state, and to transition from the pre-operating state to an operating state based on the command start point pattern of bits; and wherein the link stress pattern of bits differs from the command start point pattern of bits.

14. The method of claim 13, wherein the asserting comprises:

modulating carriers with the link stress pattern of bits; and transmitting the modulated carriers over the CA links at a data rate at which the DRAM device samples the CA links when the DRAM device is in an operating state.

15. The method of claim 13, wherein:

the asserting comprises asserting the link stress pattern of bits on the CA links subsequent to a CA training procedure; and the method further comprises issuing the command start point pattern of bits over the CA bus subsequent to asserting the link stress pattern of bits on the CA links, to place the DRAM device in an operating state.

16. The method of claim 13, wherein the asserting comprises:

asserting the link stress pattern of bits at a phase offset of a sample clock of the DRAM device.

17. The method of claim 13, wherein the link stress pattern of bits is programmable by a host system via a host interface of the DRAM device.

* * * * *